United States Patent [19]

Leung

[11] Patent Number: 5,109,149
[45] Date of Patent: Apr. 28, 1992

[54] LASER, DIRECT-WRITE INTEGRATED CIRCUIT PRODUCTION SYSTEM

[76] Inventor: Albert Leung, 1337 Wynbrook Pl., Burnaby, Canada V5A 3Y6

[21] Appl. No.: 493,938

[22] Filed: Mar. 15, 1990

[51] Int. Cl.⁵ .............................................. B23K 9/00
[52] U.S. Cl. ........................... 219/121.69; 219/121.73; 219/121.74; 219/121.75; 219/121.8
[58] Field of Search ................... 219/121.74, 121.75, 219/121.68, 121.69, 121.78, 121.82, 121.8

[56] References Cited

U.S. PATENT DOCUMENTS 4,456,812 6/1984 Neiheisel et al. .............. 219/121.74

FOREIGN PATENT DOCUMENTS 1-306088 12/1989 Japan ................................. 219/121.8

OTHER PUBLICATIONS

"Two Interconnection Techniques for Large-Scale Circuit Integration", IBM Journal, Sep. 1967, pp. 520-526.
"Laser Speeds Gate-Array Hookup", Electronics Week/Feb. 4, 1985, pp. 21 and 24.

*Primary Examiner*—C. L. Albritton
*Attorney, Agent, or Firm*—Chernoff, Vilhauer, McClung & Stenzel

[57] ABSTRACT

A laser, direct-write system for making personalized custom or semi-custom integrated circuits with a very fast turnaround time. The system includes a method and apparatus for high percision scanning of a submicron laser spot. The laser beam is scanned at the entrance of a beam expander. The beam expander reduces the scan angle and error produced by a mechanical scanning device such as a rotating polygonal mirror. The smaller scan angle at the output of the beam expander matches well with the projection optics of a laser, direct-write semi-custom integrated circuit production system. The scan error reduction permits more accurate positioning of the focussed laser spot on the surface of the semi-custom integrated circuit.

10 Claims, 3 Drawing Sheets

LASER, DIRECT-WRITE INTEGRATED CIRCUIT PRODUCTION SYSTEM

TECHNICAL FIELD OF THE INVENTION

This invention is directed to a laser, direct-write apparatus and process for producing a personalized custom or semi-custom integrated circuit wafer. In one aspect, the invention relates to an optical system which provides high precision scanning of a focussed laser spot.

BACKGROUND OF THE INVENTION

Laser scanning has been used in many fields. Laser printers, bar code readers and optical tape data recorders are examples of laser scanning applications. Laser scanning is also important in the semiconductor industry. It has been used in scanning laser microscopes, semiconductor processing, and in laser pattern generators which produce reticles for wafer steppers.

By far the most widely used laser scanning device is the rotating polygonal mirror which is found in almost every laser printer. The optical system in a typical laser printer involves a laser source, an acousto-optic modulator, a beam expander, a rotating polygonal mirror and a cylindrical focussing lens. The laser beam is switched at very high speed by the acousto optics modulator and then expanded to a desirable diameter. The expanded laser beam is then scanned and focussed, producing a scan line of tens of centimetres in length with up to thousands of resolvable spots. The spot size for a typical laser printer is in the order of tens of microns (1 micron =0.001 mm).

Two articles disclose integrated circuit processes which have relevance to this field of technology.

IBM Journal—September, 1967, Pages 520–526

The IBM Journal article indicates that the system disclosed therein uses either ultraviolet light or an electron beam light to expose photoresists on a mechanically translated wafer. The process involves converting computer-generated wiring instructions into metallic conductors on a semiconductor wafer. In both the ultraviolet light and electron beam embodiments, wafers are translated under the energy source while attached to a table which is driven by stepping motors so as to carry out programmed X-Y movement. The exposed portions of the photoresist are subsequently washed away. The ultraviolet light or the electron beam are controlled in an on-off manner by electromechanical shutters, which in turn are controlled by a computer program.

Electronics Week—Feb. 4, 1985, Pages 21 to 24

The Lasarray ray process as described in the Electronics Week article discloses an apparatus and a process whereby a precisely guided laser beam and conventional etching methods are used to produce custom integrated circuits in small lots in short turn around time. The process uses prestructured wafers and does not include customer-specific masks. The wafer is moved in line-by-line fashion in 1 micron steps under a laser gun that produces a stationary beam of blue light focussed to a spot diameter of 2 microns. The beam is turned on and off under computer control. Exposed areas of the wafer are subsequently etched.

SUMMARY OF THE INVENTION

The apparatus and process of the invention are used in a laser, direct-write process to provide personalized custom or semi-custom integrated circuits with a very short turnaround time. I have invented a high production rate laser, direct-write system for exposing the photoresist layer on a semi-custom integrated circuit wafer without a mask. This maskless process eliminates tooling (mask making) and makes it possible to personalize small quantities (less than 500) of semi-custom integrated circuits at low cost and with a fast turnaround time.

The invention pertains to a high precision laser scanning and focussing system which comprises scanning a laser beam, passing the beam through a beam expander, and then focussing the beam onto a surface. The beam expander gives a large diameter laser beam which can be focussed by a lens to a small spot on the surface. The expanded laser beam can be projected through a microscope objective to focus the beam on the surface.

In the system as defined, the surface can be a photoresist coated integrated circuit wafer. The position of the integrated circuit wafer in relation to the focussed laser spot can be controlled by a movable surface on which the wafer is positioned. In the system, the laser beam can be generated from a helium cadmium laser source, and the beam can be switched on or off by an acousto-optic modulator. The switched on laser beam can be scanned by a resonant scanner or can be scanned by a rotating polygonal mirror located at the entrance of the beam expander.

The invention is also directed to a laser, direct-write custom or semi-custom integrated circuit production apparatus which comprises:

(a) a laser generator which emits a laser beam;
(b) a laser beam modulator which modulates the emitted laser beam;
(c) a laser beam scanner which scans the modulated laser beam in a first direction;
(d) a beam expander which expands the diameter of the scanned laser beam;
(e) a focussing means which focusses the expanded laser beam onto a surface, the surface being movable in a direction perpendicular to the first direction; and
(f) a programmed computer means which controls the laser beam modulator and the movement of the surface.

In the apparatus, the laser generator can be a helium cadmium laser source. The modulator can be an acousto-optic modulator. The scanner can be an multi-facet rotating polygonal mirror. The focussing means can be a microscope objective. The surface can be a motorized table which is controlled by the computer and carries a photoresist coated integrated circuit wafer.

BRIEF DESCRIPTION OF THE DRAWINGS

In drawings which illustrate a specific embodiment of the invention, but which drawings should not be construed as restricting the spirit or scope of the invention in any way.

DETAILED DESCRIPTION OF SPECIFIC EMBODIMENTS OF THE INVENTION

The laser, direct-write custom or semi-custom integrated circuit (IC) production system involves a laser generator, a microscope, a programmed control computer and a motorized X-Y axis table on which the photoresist coated IC wafer is placed. The laser beam is scanned and then passed through a beam expander before it is projected onto the surface of the semi-custom IC wafer. This technique permits two very desirable goals to be simultaneously achieved: (1) a larger diameter laser beam which can be focussed to a smaller spot on the semi-custom integrated circuit wafer; and (2) the angular distance of the scanned laser beam is compressed, thereby resulting in a reduction of the scanning error.

Figure 1:
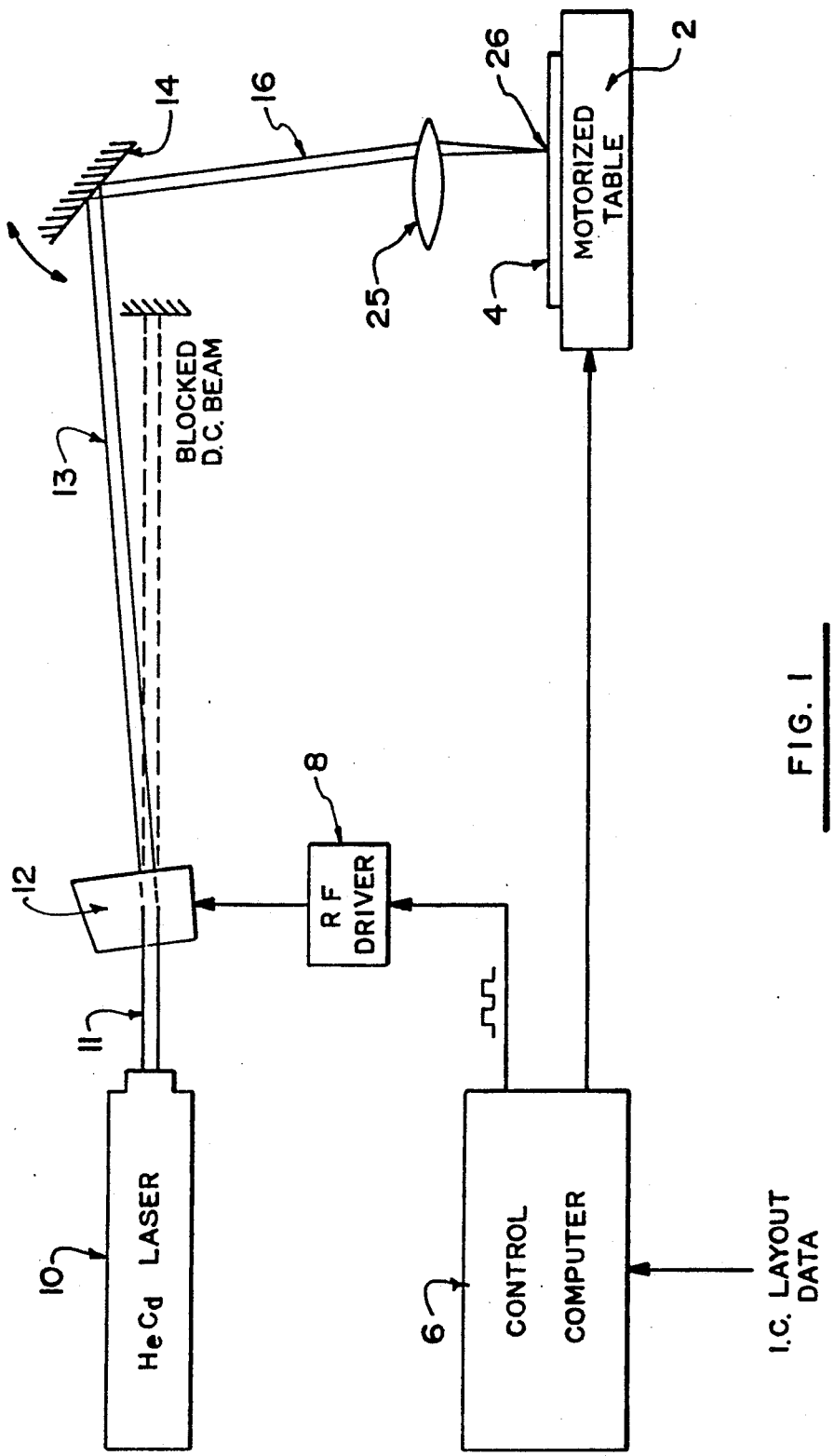
FIG. 1 illustrates a schematic diagram of the basic components of the laser, direct-write, custom or semi-custom integrated circuit production system.

The basic operation of the laser, direct-write system is illustrated in FIG. 1. A laser beam 11 is generated by a helium cadmium laser generator 10. The laser beam 11 is passed through an acousto-optic modulator 12, which is controlled by a radio frequency (RF) driver 8, controlled in turn by a control computer 6. The modulated beam 13 is directed to a scanning mirror 14, which in turn deflects and directs the beam 16 through a microscope objective 25, which focusses the beam into a spot 26 on a photoresist coated IC wafer 4 which is mounted on a motorized X-Y axis movable table 2, controlled by the control computer 6. The focussed laser spot 26 is in the order of 0.7 micron after it is projected through the microscope objective 25 onto the photoresist coated integrated circuit wafer 4. Both the motorized X-Y table 2, which changes the relative position of the integrated circuit wafer 4 to the focussed laser spot 26, and the laser beam 16 are under computer control to expose the photo-resist selectively according to information stored in control computer 6. Through this technique, an interconnect pattern of an integrated circuit can be transferred from computer stored data to the photoresist layer of the integrated circuit wafer 4 directly. The laser scanning mirror 14 improves the throughput of the system by enabling the beam 16 and the focussed spot 26 to be moved along the Y-axis. The table 2 has a certain amount of inertia and this restricts the ability of the table 2 to be moved rapidly along both the X and Y axis. Moving the laser beam 16 along the Y-axis coupled with movement of the table along only the X-axis, increases the overall speed of production by orders of magnitude. The scanning mirror 14 is used to deflect the laser beam 16 in order to produce a 256-micron Y-axis scan line. There are two major problems that arise by employing a mechanical scanning device 14, such as a rotating polygonal mirror, in this procedure. For an average grade, motor-driven, rotating polygonal mirror 14, the accuracy of scanning is in the order of ±30 arc seconds. When a 50× microscope objective with a focal length of 5 mm is used to focus the laser spot 26 onto the integrated circuit wafer surface 4, the angular distance of two points one micron apart is 41 arc seconds. It therefore follows that the use of an average grade rotating polygonal mirror 14 limits the accuracy of the direct-write system to about 0.8 micron, which is unsatisfactory.

The other disadvantage of using the rotating polygonal mirror 14 is that while the polygonal mirror provides a very wide scan angle (an 8-facet unit provides a scan angle of up to 90 degrees by each facet), the projection optics (the microscope objective 25) of the laser, direct-write system accepts only ±1.5 degree deflection of the incoming laser beam 16. As a result, the laser power can only be utilized at a very low duty cycle, leading to a significant decrease in throughput.

Figure 2:
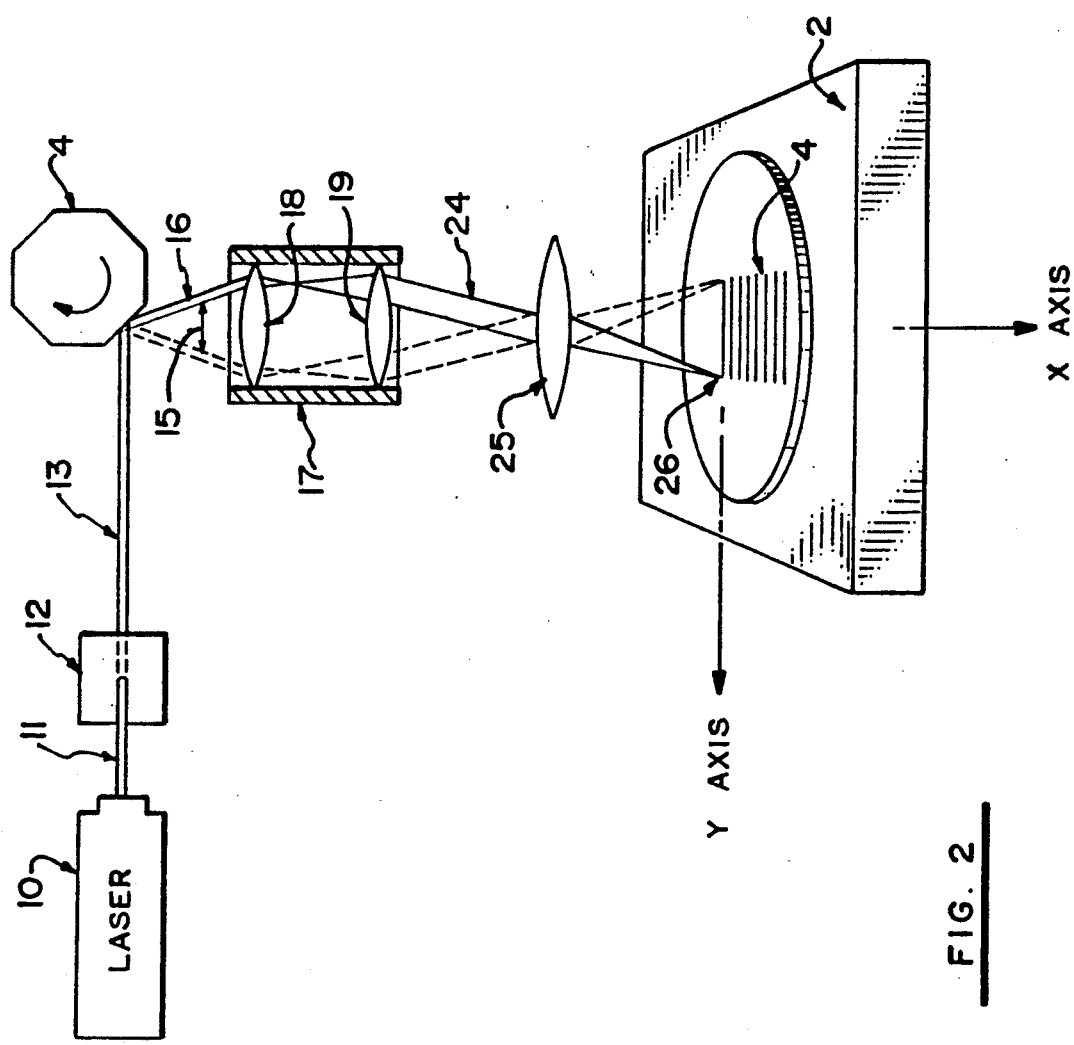
FIG. 2 illustrates a schematic diagram of the beam scanning components of the laser, direct-write system.

To solve the two foregoing problems, I have invented a scanning system which is described below in association with FIG. 2. FIG. 2 illustrates the details of the optical path of the scanned laser beam. The laser light source 10 is a helium cadmium, 442 nanometer wavelength laser with an output power of 10 milliwatts. The output beam 11 has a 0.3 millimeter diameter. This laser beam 11 is switched on and off by an acousto-optic modulator 12. The modulator switched laser beam 13 is then deflected by a rotational 8-facet polygonal mirror 14 which produces a scan angle 15, which is typically 30 degrees peak-to-peak. It will be understood by those skilled in the art that the same scanning function can be provided by other types of mechanical scanners such as a resonant scanner (for example, a resonant scanner made by General Scanning of Watertown, Mass., USA). The deflected laser beam 16 then enters a beam expander 17.

Figure 3:
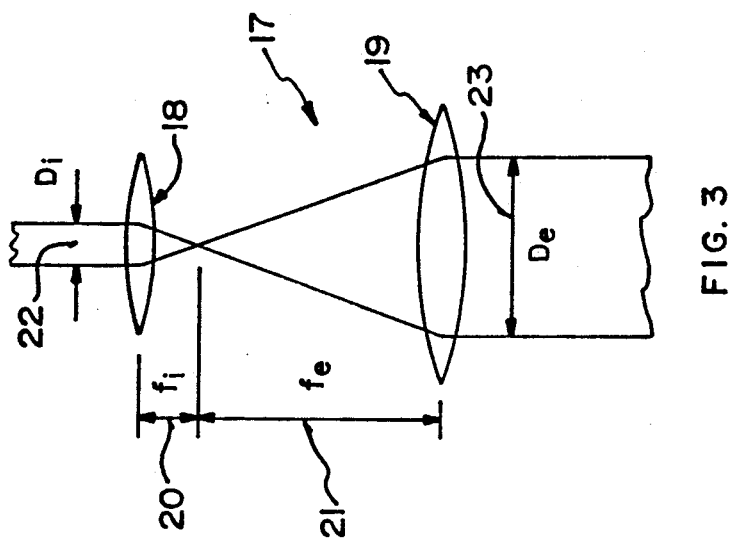
FIG. 3 illustrates a detail view of the optics of the beam expander component of the laser, direct-write system.

The beam expander 17, shown in detail in FIG. 3, consists of at least two lenses. The entrance lens 18 has a focal length $f_i$ 20 and the exit lens 19 has a focal length $f_e$ 21. The expansion ratio, defined as the ratio of the output beam diameter $D_e$ 23 and the input beam diameter $D_i$ 22, is given by $f_e/f_i$.

Referring again to FIG. 2, the scanned expanded laser beam 24 at the exit of the beam expander 17 has a diameter of about 3 millimeters. At the same time, the scan angle at the exit of the beam expander 17 is reduced by a factor of $f_e/f_i$, that is, the beam expansion ratio. It follows that the error of the mechanical scanner system is reduced by this same ratio, which is typically 10.

The scanned laser beam 24 at the exit of the beam expander 17 is then focused through a 50× microscope objective 25 which has a focal length of 5 millimeters. This produces a 256-micron scanned line on the surface of the integrated circuit wafer 4 with a positioning accuracy of 0.1 micron.

Scanning the laser beam in this direct-write system provides a very high resolution and accuracy. The system can provide a submicron laser spot with a placement accuracy of 0.1 micron on the semicustom integrated circuit. This accuracy is orders of magnitude higher than those required in a typical laser printer application.

Figure 4:
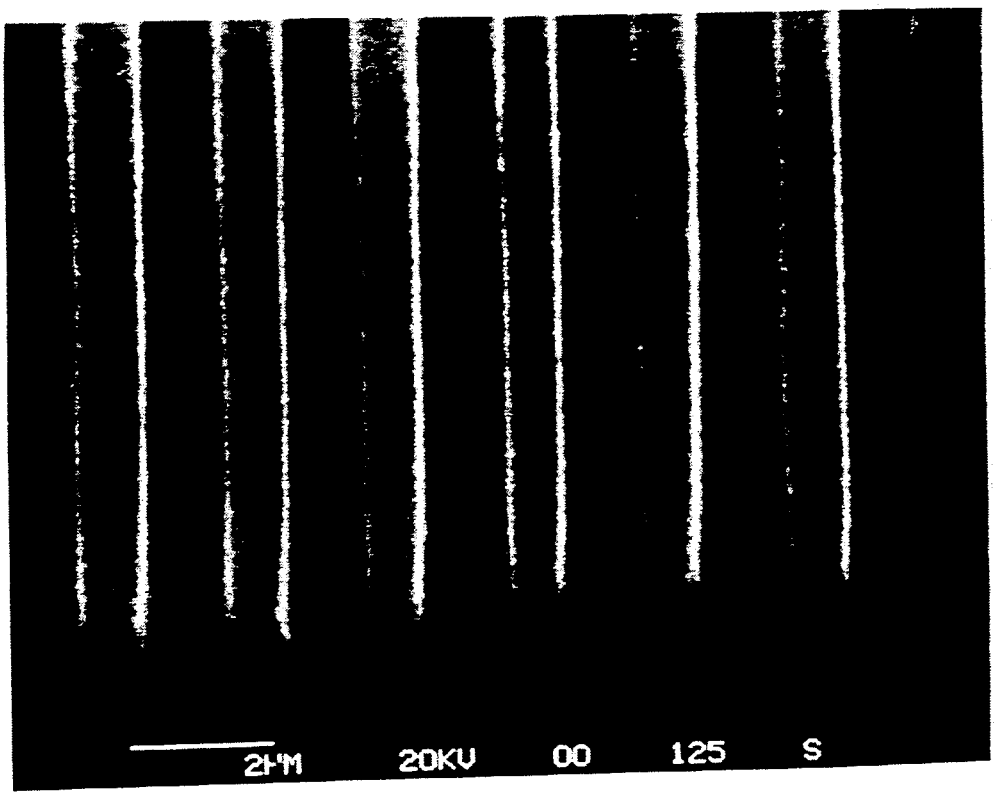
FIG. 4 illustrates an example of a high resolution photoresist pattern produced by the laser, direct-write system.

A photoresist test pattern produced by the laser, direct-write system is shown in FIG. 4. This test pattern, consisting of 1-micron wide lines and spaces on a 1-micron thick photoresist, illustrates how fine a photoresist pattern can be produced by the laser, direct-write system of the invention.

Figure 5:
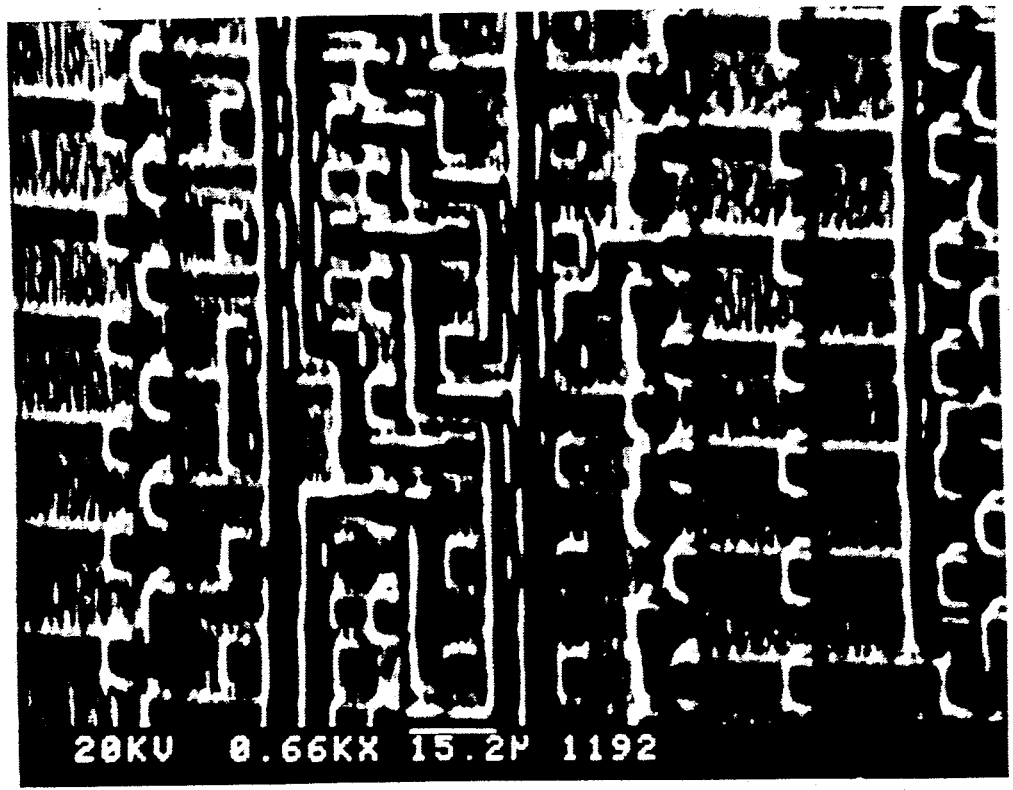
FIG. 5 illustrates an example of an interconnect photoresist pattern produced on a semi-custom integrated circuit, in this case a complementary metal-oxide semiconductor (CMOS) gate array.

An interconnect photoresist pattern produced by the laser, direct-write system on a complementary metal oxide semi-conductor (CMOS) gate array is shown in FIG. 5. In a subsequent metalization etching process, the interconnect metal underneath the patterned photoresist will be left behind.

A key advantage of the disclosed technique is that it can use an inexpensive mechanical scanning device, such as a rotating polygonal mirror, to position a focussed laser spot with an accuracy of 0.1 micron.

In distinction to all other laser scanning systems, the system scans the laser beam at the entrance of a beam expander. This arrangement allows the beam expander to reduce the scan angle and error produced by a mechanical scanning device such as a rotating polygonal mirror. The smaller scan angle at the output of the beam expander matches well with the projection optics of the laser, direct-write system, and the scan error reduction permits more accurate positioning of the focussed laser spot on the surface of the semi-custom integrated circuit.

The subject laser scanning system has a helium cadmium laser source, the output of which is turned on and off at high speed by an acousto-optic modulator. The switched laser beam is scanned by either a resonant scanner or a rotating polygonal mirror at the entrance of a 10× beam expander. At the exit of the beam expander, the laser beam diameter is increased by the expansion ratio (10×), while the scan angle is reduced by the same amount. Since only a small scan angle, typically 3 degrees peak-to-peak, is required in the direct-write projection optics, this arrangement allows the beam expander to serve two very important objectives: (1) by expanding the laser beam before focussing it through the objective, a smaller laser spot can be produced; (2) by reducing the exit laser beam scan angle, the beam expander decreases the angular error produced by the mechanical scanner, thereby resulting in a shorter but more accurate scan line when the exit laser beam is projected through a microscope objective.

As will be apparent to those skilled in the art in the light of the foregoing disclosure, many alterations and modifications are possible in the practice of this invention without departing from the spirit or scope thereof. Accordingly, the scope of the invention is to be construed in accordance with the substance defined by the following claims.

I claim:

1. A method for high precision laser scanning and focussing which comprises scanning a laser beam, passing thereafter the beam through a beam expander, and then focussing the beam onto a surface.

2. A method as claimed in claim 1 wherein the beam expander gives a large diameter laser beam which is focussed by a lens to a small spot on the surface.

3. A method for high precision laser scanning and focussing which comprises scanning a laser beam, passing the beam through a beam expander, and then focussing the beam onto a surface by projecting the expanded laser beam through a microscope objective to focus the beam on the surface.

4. A method as claimed in claim 3 wherein the surface is a photoresist coated integrated circuit wafer.

5. A method as claimed in claim 4 wherein the position of the integrated circuit wafer in relation to the focussed laser beam is controlled by a movable surface on which the wafer is positioned.

6. A method as claimed in claim 5 wherein the laser beam is generated from a helium cadmium laser source, and the beam is switched on or off by an acousto-optic modulator.

7. A method as claimed in claim 6 wherein the switched on laser beam is scanned by a resonant scanner.

8. A method as claimed in claim 6 wherein the switched on laser beam is scanned by a rotating polygonal mirror located at the entrance of the beam expander.

9. A method for high precision laser scanning and focussing which comprises scanning a laser beam emitted from a laser source and having a first diametrical width to produce a first scan angle, and thereafter passing the scanned beam through a beam expander which expands the beam to form an expanded beam having a second diametrical width, said beam expander reducing the first scan angle to a second scan angle inversely proportional to a beam expansion ratio of the first diametrical width relative to the second diametrical width, and then focussing the expanded beam onto a surface.

10. A method as claimed in claim 9 wherein the beam expander produces a large diameter laser beam which is focussed by a lens to a small spot on the surface.

* * * * *